United States Patent
Hou

(10) Patent No.: US 12,324,305 B2
(45) Date of Patent: Jun. 3, 2025

(54) ELECTROLUMINESCENT DIODE ARRAY SUBSTRATE HAVING AN AUXILIARY ELECTRODE FORMED IN A VIA HOLE STRUCTURE THAT EXTENDS FROM THE PIXEL DEFINITION LAYER AND PENETRATES THROUGH THE PLANARIZATION LAYER THEREUNDER

(71) Applicant: BOE TECHNOLOGY GROUP CO., LTD., Beijing (CN)

(72) Inventor: Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 61 days.

(21) Appl. No.: 17/955,920

(22) Filed: Sep. 29, 2022

(65) Prior Publication Data
US 2023/0033003 A1   Feb. 2, 2023

Related U.S. Application Data

(63) Continuation of application No. 16/308,883, filed as application No. PCT/CN2018/091952 on Jun. 20, 2018, now abandoned.

(30) Foreign Application Priority Data

Jun. 30, 2017   (CN) .......................... 201710558592.2

(51) Int. Cl.
*H01L 51/52*       (2006.01)
*H10K 50/80*       (2023.01)
(Continued)

(52) U.S. Cl.
CPC ......... *H10K 59/1315* (2023.02); *H10K 50/80* (2023.02); *H10K 50/814* (2023.02);
(Continued)

(58) Field of Classification Search
CPC .......................... H10K 50/824; H10K 59/122
See application file for complete search history.

(56) References Cited

U.S. PATENT DOCUMENTS

| 7,291,973 B2 | 11/2007 | Ishihara |
| 10,644,255 B2 | 5/2020 | Hou |

(Continued)

FOREIGN PATENT DOCUMENTS

| CN | 103296052 A | 9/2013 |
| CN | 103311265 A | 9/2013 |

(Continued)

OTHER PUBLICATIONS

International Search Report mailed on Sep. 10, 2018.
(Continued)

*Primary Examiner* — Anh D Mai
(74) *Attorney, Agent, or Firm* — Dilworth & Barrese, LLP.; Michael J. Musella, Esq.

(57) ABSTRACT

An electroluminescent diode array substrate, a method of manufacturing the electroluminescent diode array substrate and a display panel are provided. The electroluminescent diode array substrate includes: a base substrate; and an auxiliary electrode, a pixel definition layer, a first electrode, a functional layer and a second electrode disposed on the base substrate, the pixel definition layer is provided with a via hole structure, the auxiliary electrode is disposed on at least one side of the via hole structure, and the second electrode is electrically connected with the auxiliary electrode. The electroluminescent diode array further comprises a planarization layer disposed between the base substrate and the pixel definition layer, and a conductive polymer layer. The via hole structure extends from the pixel defini-
(Continued)

tion layer and penetrates through the planarization layer, the auxiliary electrode comprises an embedment part embedded in the planarization layer.

14 Claims, 5 Drawing Sheets

(51) Int. Cl.
  *H10K 50/814* (2023.01)
  *H10K 50/824* (2023.01)
  *H10K 59/00* (2023.01)
  *H10K 59/122* (2023.01)
  *H10K 59/131* (2023.01)
  *H10K 59/80* (2023.01)
  *H10K 71/00* (2023.01)
  *H10K 71/13* (2023.01)

(52) U.S. Cl.
  CPC ........... *H10K 50/824* (2023.02); *H10K 59/00* (2023.02); *H10K 59/122* (2023.02); *H10K 59/80522* (2023.02); *H10K 71/00* (2023.02); *H10K 71/135* (2023.02)

(56) References Cited

U.S. PATENT DOCUMENTS

| | | |
|---|---|---|
| 2005/0179374 A1 | 8/2005 | Kwak |
| 2011/0108877 A1 | 5/2011 | Yamada |
| 2014/0284591 A1 | 9/2014 | Ono |
| 2014/0315339 A1* | 10/2014 | Kim .................. H10K 71/611 438/34 |
| 2015/0090989 A1 | 4/2015 | Matsumoto et al. |
| 2015/0144902 A1 | 5/2015 | Do et al. |
| 2016/0043341 A1 | 2/2016 | Heo et al. |
| 2016/0293888 A1 | 10/2016 | Shim et al. |
| 2017/0148865 A1 | 5/2017 | Cho et al. |
| 2018/0233691 A1 | 8/2018 | Ajiki |
| 2018/0294428 A1 | 10/2018 | Nishimura |

FOREIGN PATENT DOCUMENTS

| | | |
|---|---|---|
| CN | 104466021 A | 3/2015 |
| CN | 106057844 A | 10/2016 |
| CN | 107331691 A | 11/2017 |
| EP | 3029751 A1 | 6/2016 |
| EP | 3046157 A1 | 7/2016 |
| EP | 3098854 A1 | 11/2016 |
| EP | 3113230 A1 | 1/2017 |
| JP | 2009176495 A | 8/2009 |

OTHER PUBLICATIONS

Extended European Search Report from European Patent Application No. 18811433.4 dated Feb. 24, 2021.
Office Action Mailed Aug. 24, 2020 in U.S. Appl. No. 16/308,883.
Final Office Action Mailed Jul. 26, 2021 in U.S. Appl. No. 16/308,883.
Office Action Mailed Dec. 13, 2021 in U.S. Appl. No. 16/308,883.

* cited by examiner

ELECTROLUMINESCENT DIODE ARRAY SUBSTRATE HAVING AN AUXILIARY ELECTRODE FORMED IN A VIA HOLE STRUCTURE THAT EXTENDS FROM THE PIXEL DEFINITION LAYER AND PENETRATES THROUGH THE PLANARIZATION LAYER THEREUNDER

This application is a continuation application of U.S. patent application Ser. No. 16/308,883 filed on Dec. 11, 2018, which is a U.S. National Phase Entry of International Application No. PCT/CN2018/091952 filed Jun. 20, 2018, which claims priority to and the benefit of Chinese patent application No. 201710558592.2 filed on Jun. 30, 2017. The above-identified applications are incorporated by reference herein in their entirety.

TECHNICAL FIELD

Embodiments of the present disclosure relate to an electroluminescent diode array substrate, a method of manufacturing the electroluminescent diode array substrate, and a display panel.

BACKGROUND

Electroluminescent diodes have advantages of simple manufacturing process, low production cost, high light-emitting efficiency, being easy to form flexible structures, low power consumption, high color saturation, wide viewing angle, and so on. A display technology by using electroluminescent diodes has become an important display technology.

An electroluminescent diode comprises an organic light-emitting diode (OLED), a quantum dot light-emitting diode (QLED) or the like. For example, an organic light-emitting diode (OLED) array substrate comprises a plurality of pixel units, and each of the pixel units comprises a switching transistor, a driving transistor, an OLED display device and so on. The OLED display device is a current-driven light-emitting device, and the OLED display device mainly comprises an anode, a cathode and an organic material functional layer. The working principle of the OLED display device is that the organic material functional layer is driven by an electric field formed by the anode and the cathode, then carriers are injected and recombined to emit light. The quantum dot light-emitting diode (QLED) has a similar structure to the organic light-emitting diode (OLED). The main difference between the quantum dot light-emitting diode (QLED) and the organic light-emitting diode is that the luminescence center of the QLED is composed of quantum dots, and the light-emitting principle of the quantum dot light-emitting diode (QLED) is that electrons and holes are combined to form photons in a quantum dot layer, then the photons are recombined to emit light.

SUMMARY

At least one embodiment of the present disclosure provides an electroluminescent diode array substrate, and the electroluminescent diode array substrate includes: a base substrate, and an auxiliary electrode, a pixel definition layer, a first electrode, a functional layer, and a second electrode which are disposed on the base substrate, and the pixel definition layer is provided with a via hole structure; the auxiliary electrode is disposed on at least one side of the via hole structure; and the second electrode is electrically connected with the auxiliary electrode, the electroluminescent diode array further comprises a planarization layer disposed between the base substrate and the pixel definition layer, and a conductive polymer layer, wherein the via hole structure extends from the pixel definition layer and penetrates through the planarization layer, the auxiliary electrode comprises an embedment part embedded in the planarization layer, the embedment part is electrically connected with the second electrode and the embedment is not directly in contact with the second electrode, the conductive polymer layer is disposed on a side of the functional layer away from the base substrate, both of an orthographic projection of the conductive polymer layer on the base substrate and an orthographic projection of the functional layer on the base substrate are completely within an orthographic projection of the via hole on the base substrate.

For example, in the electroluminescent diode array substrate provided by at least one embodiment of the present disclosure, a surface of the embedment part away from the base substrate is closer to the base substrate than a surface of the planarization layer away from the base substrate.

For example, in the electroluminescent diode array substrate provided by at least one embodiment of the present disclosure, the functional layer comprises a bottom surface close to the base substrate and an upper surface away from the base substrate, and a side face connecting the bottom surface and the bottom surface, a distance from the upper surface to the base substrate is less than a distance from the surface of the embedment part to the base substrate, and the embedment part is directly in contact with side face.

For example, in the electroluminescent diode array substrate provided by at least one embodiment of the present disclosure, wherein a thickness of the conductive polymer layer is larger than a thickness of the planarization layer in a direction perpendicular to the base substrate, and a material of the conductive polymer layer is different from a material of the functional layer.

For example, in the electroluminescent diode array substrate provided by at least one embodiment of the present disclosure, an upper surface of the auxiliary electrode is higher than an upper surface of the functional layer in the via hole structure.

For example, in the electroluminescent diode array substrate provided by at least one embodiment of the present disclosure, the auxiliary electrode is a structure in a U shape.

For example, in the electroluminescent diode array substrate provided by at least one embodiment of the present disclosure, the auxiliary electrode is a plate-type structure; or there are a plurality of auxiliary electrodes which are spaced apart from each other.

For example, in the electroluminescent diode array substrate provided by at least one embodiment of the present disclosure, a conductive polymer layer is provided in the via hole structure, and the second electrode is electrically connected with the auxiliary electrode by the conductive polymer layer.

For example, in the electroluminescent diode array substrate provided by at least one embodiment of the present disclosure, a thickness of the conductive polymer layer is less than a thickness of the pixel definition layer.

For example, in the electroluminescent diode array substrate provided by at least one embodiment of the present disclosure, a conductivity of the conductive polymer layer is greater than $10^{-6}$ S/m.

For example, in the electroluminescent diode array substrate provided by at least one embodiment of the present disclosure, a material of the conductive polymer layer comprises at least one of polypyrrole, polyphenylene sulfide, polyphthalocyanine, polyaniline and polythiophene.

For example, in the electroluminescent diode array substrate provided by at least one embodiment of the present disclosure, a thickness of the conductive polymer layer is smaller than a sum of a thickness of the planarization layer and a thickness of the pixel definition layer.

For example, in the electroluminescent diode array substrate provided by at least one embodiment of the present disclosure, an upper surface of the conductive polymer layer is flush with an upper surface of the pixel definition layer.

For example, in the electroluminescent diode array substrate provided by at least one embodiment of the present disclosure, there are a plurality of via hole structures penetrating through the planarization layer and the pixel definition layer, and the second electrode is electrically connected with the auxiliary electrode by the plurality of via hole structures.

For example, in the electroluminescent diode array substrate provided by at least one embodiment of the present disclosure, a thickness of the functional layer is from about 100 nm to about 300 nm, a thickness of the auxiliary electrode is from about 0.5 μm to about 1 μm, a thickness of the planarization layer is from about 1 μm to about 3 μm, a thickness of the pixel definition layer is from about 1 μm to about 3 μm, and a thickness of the conductive polymer layer is from about 2 μm to about 5.7 μm.

For example, in the electroluminescent diode array substrate provided by at least one embodiment of the present disclosure, the functional layer comprises at least one of a light-emitting layer, an electron injection layer, an electron transmission layer, a hole injection layer and a hole transmission layer.

At least one embodiment of the present disclosure further provides a display panel, and the display panel includes any one of the electroluminescent diode array substrate described above.

At least one embodiment of the present disclosure further provides a method of manufacturing an electroluminescent diode array substrate, and the method includes: providing a base substrate, forming an auxiliary electrode, a pixel definition layer, a first electrode, a functional layer and a second electrode on the base substrate, and the pixel definition layer is provided with a via hole structure; the auxiliary electrode is disposed on at least one side of the via hole structure; and the second electrode is electrically connected with the auxiliary electrode, before forming the auxiliary electrode, the method further comprises: forming a planarization layer between the base substrate and the pixel definition, wherein the via hole structure extends from the pixel definition layer and penetrates through the planarization layer, the auxiliary electrode comprises an embedment part embedded in the planarization layer, the embedment part is electrically connected with the second electrode and the embedment is not directly in contact with the second electrode, the method further comprises forming a conductive polymer layer, the conductive polymer layer is disposed on a side of the functional layer away from the base substrate, both of an orthographic projection of the conductive polymer layer on the base substrate and an orthographic projection of the functional layer on the base substrate are completely within an orthographic projection of the via hole on the base substrate.

For example, in the method provided by at least one embodiment of the present disclosure, an upper surface of the auxiliary electrode which is formed on at least one side of the via hole structure is higher than an upper surface of the functional layer in the via hole structure.

For example, in the method provided by at least one embodiment of the present disclosure, the conductive polymer layer is formed by an inkjet printing method.

BRIEF DESCRIPTION OF THE DRAWINGS

In order to clearly illustrate the technical solution of the embodiments of the disclosure, the drawings of the embodiments will be briefly described. It is apparent that the described drawings are only related to some embodiments of the disclosure and thus are not limitative of the disclosure.

Figure 1:
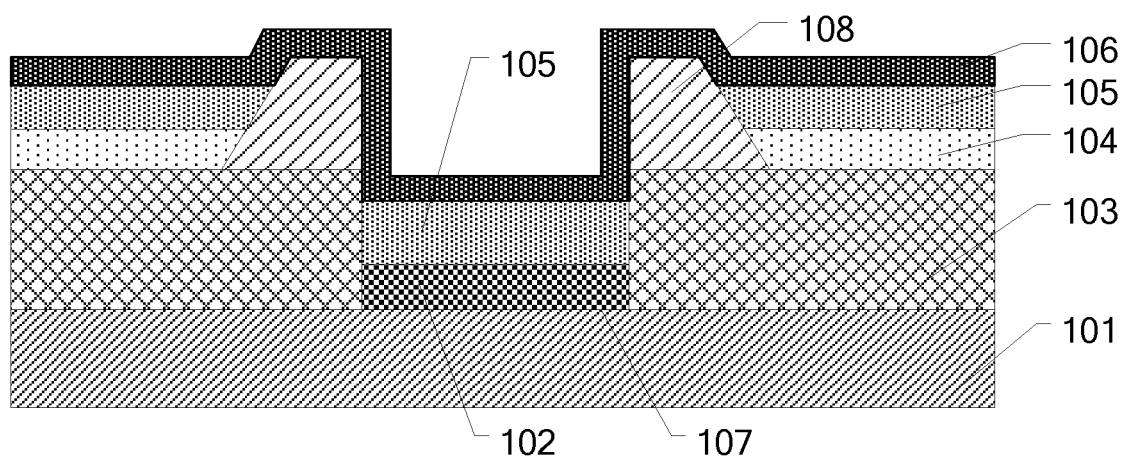
FIG. 1 is a schematic sectional view of an organic light-emitting diode (OLED) array substrate.

REFERENCE NUMERALS 101, 201—base substrate; 102, 202—auxiliary electrode; 103, 203—planarization layer; 104, 204—first electrode; 105—organic material functional layer; 205—functional layer; 106, 206—second electrode; 107, 207—via hole structure; 108, 208—pixel definition layer; 209—conductive polymer layer; 1—display panel; 2—electroluminescent diode array substrate; 20—OLED device; 30—switching transistor; 40—driving transistor.

DETAILED DESCRIPTION

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may include an electrical connection which is direct or indirect. The terms "on," "under," "right," "left" and the like are only used to indicate relative position relationship, and when the position of an object is described as being changed, the relative position relationship may be changed accordingly.

Electroluminescent diodes, for example, organic light-emitting diodes (OLED) and quantum dot light-emitting diodes (QLED) are mostly current-driven devices. In a case where an external circuit used for providing a driving current is too long or too thin, the external circuit leads to a serious voltage gradient (a voltage drop). To reduce the voltage drop, an auxiliary electrode is usually added in an electroluminescent diode display device. For example, the auxiliary electrode is formed on the electroluminescent diode array substrate, and the auxiliary electrode is electrically connected with a cathode by a via hole structure. However, in the process of manufacturing an OLED device, especially in the process of manufacturing a large-sized OLED panel, an organic material is evaporated at the via hole structure, and the organic material separates the cathode from the auxiliary electrode. In the process of manufacturing a QLED device, especially in the process of manufacturing a large-sized QLED panel, a quantum dot light-emitting layer is printed at the via hole structure, and the quantum dot light-emitting layer separates the cathode from the auxiliary electrode.

For example, the organic light-emitting diode array substrate is taken for an example. FIG. 1 is a schematic sectional view of an organic light-emitting diode (OLED) array substrate. As illustrated in FIG. 1, the organic light-emitting diode array substrate comprises: a base substrate 101; and an auxiliary electrode 102, a planarization layer 103, a first electrode 104, an organic material functional layer 105, a second electrode 106 and a pixel definition layer 108 disposed on the base substrate; and the planarization layer 103 is provided with a via hole structure 107.

For example, the second electrode 106 of the OLED array substrate is generally made of metallic silver with a thinner thickness, and the first electrode 104 is generally made of indium tin oxide (ITO), and both the resistivity of the metal silver with a thinner thickness and the resistivity of the indium tin oxide (ITO) are high, and especially for the second electrode 106 with a large area, the second electrode 106 made of the thin metal silver has a higher resistivity, and the voltage drop (IR drop) is larger; in this case, the actual driving voltage of the OLED array substrate is greatly different from a power voltage, and in a large-sized OLED display device, a large area of uneven brightness phenomenon occurs, which affects the display effect. As illustrated in FIG. 1, the auxiliary electrode 102 formed on the base substrate 102 reduces the resistance of the second electrode 106. However, the subsequently formed organic material functional layer 105 separates the auxiliary electrode 102 from the second electrode 106, thus the auxiliary electrode 102 can't be in parallel connect with the second electrode 106, and can't reduce the voltage drop effectively.

The inventor of the present disclosure notes that changing the structural design of the auxiliary electrode can ensure that the second electrode is electrically connected with the auxiliary electrode, in this way, the auxiliary electrode electrically connected with the second electrode increases the equivalent thickness of the second electrode, thereby the resistance of the second electrode is reduced, and the problem that the large voltage drop caused by the large resistance of the second electrode in a case where the second electrode made of metallic silver with a thinner thickness is avoided, furthermore, the problem of damaging an organic light-emitting display panel due to the large voltage drop is avoided as well.

At least one embodiment of the present disclosure provides an electroluminescent diode array substrate, and the electroluminescent diode array substrate comprises: a base substrate, and an auxiliary electrode, a pixel definition layer, a first electrode, a functional layer, and a second electrode, which are disposed on the base substrate; the pixel definition layer is provided with a via hole structure; the auxiliary electrode is disposed on at least one side of the via hole structure; and the second electrode is electrically connected with the auxiliary electrode. The embodiment of the present disclosure ensures that the second electrode is electrically connected with the auxiliary electrode by changing the structural design of the auxiliary electrode, thereby the problem of the large voltage drop in the external circuit is avoided.

At least one embodiment of the disclosure provides an electroluminescent diode array substrate, and the electroluminescent diode array substrate is an organic light-emitting diode (OLED) array substrate or a quantum dot light-emitting diode (QLED) array substrate. The following is illustrated by taking the electroluminescent diode array substrate as the organic light-emitting diode (OLED) array substrate for example.

Figure 2:
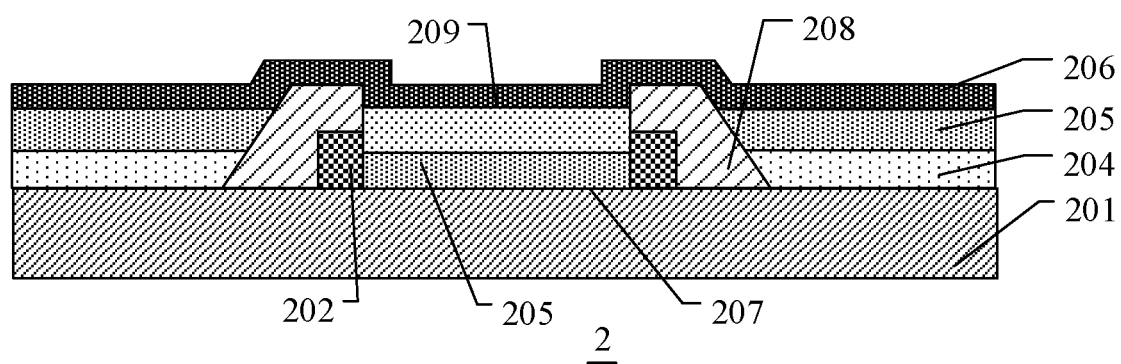
FIG. 2 is a schematic sectional view of an OLED array substrate provided by an embodiment of the present disclosure.

For example, FIG. 2 is a schematic sectional view of an OLED array substrate provided by at least one embodiment of the present disclosure. As illustrated in FIG. 2, the organic light-emitting diode array substrate 2 comprises: a base substrate 201, and an auxiliary electrode 202, a pixel definition layer 208, a first electrode 204, a functional layer 205 (for example, an organic material functional layer) and a second electrode 206 disposed on the base substrate 201, the pixel definition layer 208 is provided with a via hole structure 207, the auxiliary electrode 202 is disposed on at least one side of the via hole structure 207, and the second electrode 206 is electrically connected with the auxiliary electrode 202.

It should be noted that, the auxiliary electrode disposed on at least one side of the via hole structure not means that the auxiliary electrode is disposed on the outside or the inside of the via hole structure, but means that the auxiliary electrode is disposed on a side wall of at least one direction of the outside side of the via hole structure.

For example, an upper surface of the auxiliary electrode 202 is higher than an upper surface of the functional layer 205 of the via hole structure 207.

For example, the OLED array substrate includes a display region and a peripheral region outside the display region. The display region is also referred to as an AA (Active Area), and the display region is generally used for displaying. The peripheral region may be used for arranging a driving circuit, packaging a display panel, and the like. For example, in the peripheral region, the second electrode 206 is electrically connected with the auxiliary electrode 202, and in the display region, the second electrode 206 is electrically connected with the auxiliary electrode 202, in this way, the second electrode 206 and the auxiliary electrode 202 are connected at both ends respectively to form a parallel-connected circuit, or both ends that the second electrode 206 and the auxiliary electrode 202 connected to each other are located in the display region. In a case where the second electrode 206 receives a voltage signal and transmits the voltage signal, and the voltage signal reaches the auxiliary electrode 202 that electrically connected to the second electrode 206, the auxiliary electrode 202 transmits the voltage signal simultaneously with the second electrode 206 as a branch of the voltage signal, which is equivalent to that the second electrode 206 and the auxiliary electrode 202 form the parallel-connected circuit, in this way, the resistance in the process of electrical signal transmission is reduced; or the auxiliary electrode 202 receives the voltage signal firstly, in a case where the voltage signal reaches the second electrode 206 electrically connected to the auxiliary electrode 202, the second electrode 206 as a branch for transmitting the voltage signal simultaneously with the auxiliary electrode 202; or the second electrode 206 and the auxiliary electrode 202 receives the voltage signal simultaneously, the second electrode 206 and the auxiliary electrode 202 transmit the voltage signal simultaneously as two branches.

Figure 3:
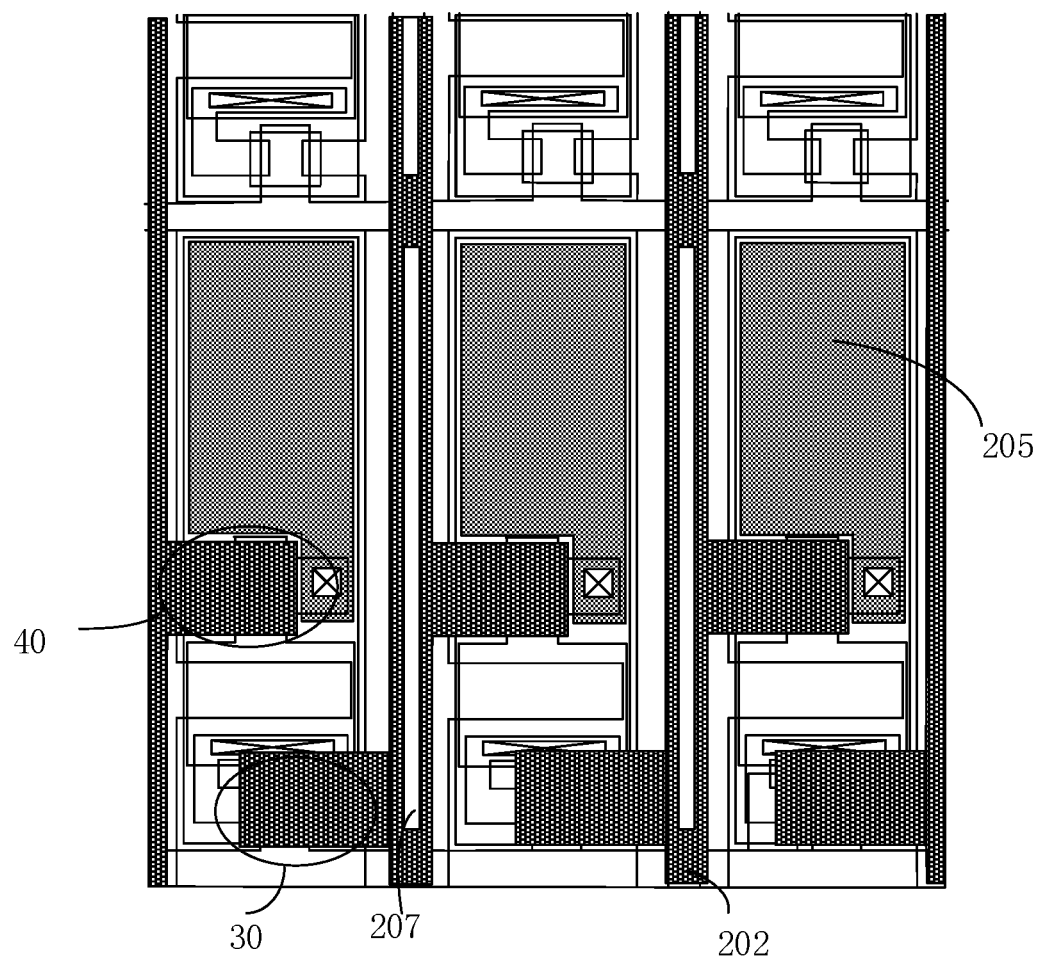
FIG. 3 is a schematic view of a planar structure of an OLED array substrate provided by an embodiment of the present disclosure.

For example, as illustrated in FIG. 3, the OLED array substrate 2 further includes a power line, a data line and a gate line (not shown in FIG. 3) disposed on the base substrate 201, a pixel structure is disposed in a region defined by the gate line and the data line intersecting with each other, for example, the pixel structure includes a switching transistor 30, a driving transistor 40, and an OLED device 20, and the switching transistor 30 is connected to the gate line and the data line, the driving transistor 40 is connected to the switching transistor 30, the power line, and the OLED device.

For example, as illustrated in FIG. 2 and FIG. 3, the pixel definition layer 208 is located between the first electrode 204 and the second electrode 206, and the pixel definition layer 208 is used for isolating two sub-pixel units adjacent to each other.

For example, the pixel structure, the gate line and the data line are located in the display region, in addition to the gate line and the data line, the OLED array substrate may further include a detection compensation line connecting a pixel unit and a detection integrated circuit. The detection compensation line is located in the display region.

For example, as illustrated in FIG. 2, the upper surface of the auxiliary electrode 202 on at least one side of the via hole structure 207 is higher than the upper surface of the functional layer 205 in the via hole structure 207, in this way, the auxiliary electrode 202 is electrically connected to the second electrode 206 through the portion of the auxiliary electrode that higher than the upper surface of the functional layer 205 in the via hole structure 207.

Figure 4:
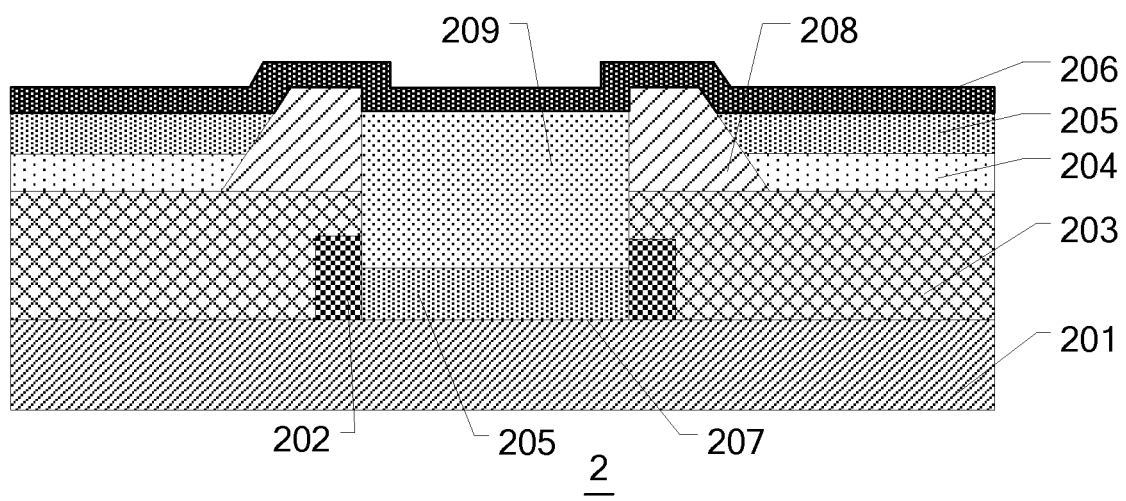
FIG. 4 is a schematic sectional view of an OLED array substrate provided by another embodiment of the present disclosure.

For example, FIG. 4 is a schematic sectional view of an OLED array substrate provided by another embodiment of the present disclosure. As illustrated in FIG. 4, the organic light-emitting diode array substrate further includes a planarization layer 203 disposed between the base substrate 201 and the pixel definition layer 208, in which the via hole structure 207 extends from the pixel definition layer 208 and penetrates through the planarization layer 203.

For example, as illustrated in FIG. 4, the via hole structure 207 extends from pixel definition layer 208 and penetrates through planarization layer 203. In this way, the depth of the via hole structure 207 is approximately equal to the sum of the thickness of the pixel definition layer 208 and the thickness of the planarization layer 203.

For example, in the embodiment of the present disclosure, the thickness of the functional layer 205 is from about 100 nm to about 300 nm, for example, the thickness of the functional layer 205 is 100 nm, 200 nm or 300 nm, etc.

For example, the thickness of auxiliary electrode 202 is from about 0.5 μm to about 1 μm, such as 0.5 μm, 0.6 μm, 0.7 μm, 0.8 μm, 0.9 μm or 1 μm, etc.

For example, the thickness of planarization layer 203 is from about 1 μm to about 3 μm, such as 1 μm, 2 μm or 3 μm, etc.

For example, the thickness of the pixel definition layer 208 is from about 1 μm to about 3 μm, such as 1 μm, 2 μm or 3 μm, etc.

For example, the thickness of the first electrode 204 is from about 200 μm to about 300 μm, for example, 200 μm, 250 μm, or 300 μm, etc.

For example, the thickness of the second electrode 206 is from about 100 μm to about 200 μm, for example, 100 μm, 150 μm, or 200 μm, etc.

For example, in a case where the second electrode 206 is directly connected to the auxiliary electrode 202, the second electrode 206 may have a segment difference (step), that is, the second electrode 206 is broken. A conductive polymer layer 209 is arranged in the via hole structure 207 to raise the functional layer 205 so as to prevent the second electrode 206 from breaking, as illustrated in FIG. 2 and FIG. 4, the conductive polymer layer 209 is formed between the auxiliary electrode 202 and the second electrode 206. The second electrode 206 is electrically connected with the auxiliary electrode 202 through the conductive polymer layer 209 to reduce the risk of forming a segment difference of the second electrode 206.

For example, the thickness of the conductive polymer layer 209 is larger than the thickness of the planarization layer 203, and the thickness of the conductive polymer layer 209 is smaller than the sum of the thickness of the planarization layer 203 and the thickness of the pixel definition layer 208.

Figure 10:
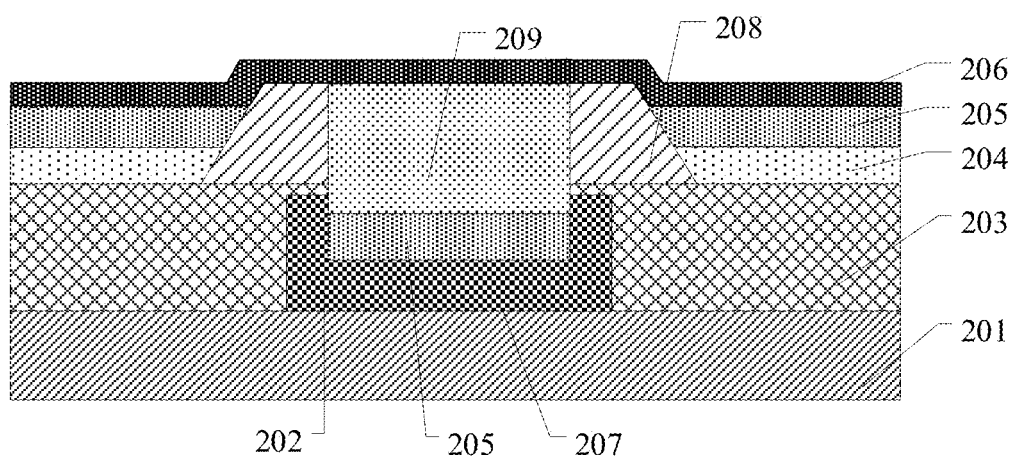
FIG. 10 a schematic sectional view of an OLED array substrate provided by another embodiment of the present disclosure.

For example, the upper surface of the conductive polymer layer 209 is flush with the upper surface of the pixel definition layer 208, as illustrated in FIG. 10, in this way, the risk that the second electrode 206 having a segment difference is basically eliminated.

For example, the thickness of the conductive polymer layer 209 is from about 2 μm to about 5.7 μm. For example, the thickness of the conductive polymer layer is 2 μm, 3 μm, 4 μm or 5 μm, etc.

For example, the conductivity of the conductive polymer layer is greater than $10^{-6}$ S/m, which ensures that the auxiliary electrode 202 is electrically connected with the second electrode 206.

For example, a material of the conductive polymer layer 209 comprises at least one of polypyrrole, polyphenylene sulfide, polyphthalocyanine, polyaniline and polythiophene.

Figure 5:
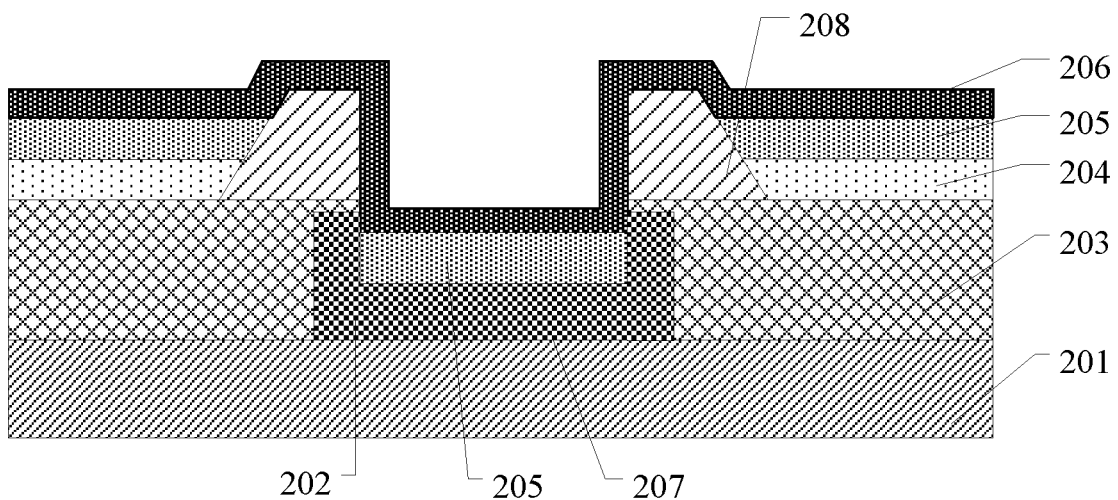
FIG. 5 is a schematic sectional view of an OLED array substrate provided by still another embodiment of the present disclosure.

For example, FIG. 5 is a schematic sectional view of an OLED array substrate provided by still another embodiment of the present disclosure. As illustrated in FIG. 5, the auxiliary electrode 202 in the via hole structure 207 is a structure in a U shape, it is equivalent to two side walls of the auxiliary electrode 202 being raised so that the second electrode 206 is directly electrically connected with the auxiliary electrode 202 at the via hole structure 207, thus the step of forming the conductive polymer layer is reduced, and the risk of forming a segment difference of the second electrode 206 reduced.

It should be noted that, the auxiliary electrode 202 is a structure in a U shape means that in the direction perpendicular to the surface of the base substrate 201, the cross-section structure of the auxiliary electrode (for example, the longitudinal cross-section of the auxiliary electrode) is in a concave shape.

Figure 6:
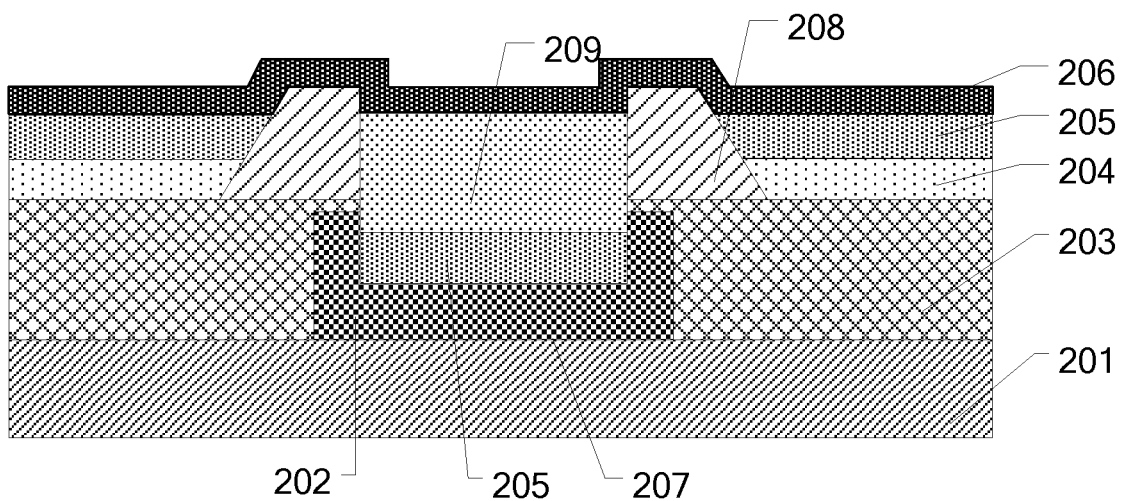
FIG. 6 is a schematic sectional view of an OLED array substrate provided by still another embodiment of the present disclosure.

For example, FIG. 6 is a schematic sectional view of an OLED array substrate provided by still another embodiment of the present disclosure. For example, the conductive polymer layer 209 is formed on the auxiliary electrode 202 in a U shape, which further reduces the risk of forming the segment difference of the second electrode 206.

For example, the auxiliary electrode 202 is a plate-type structure, and the via hole structure 207 is at least covered with the auxiliary electrode 202; or, on a plane parallel to the surface of the base substrate 201 and along the extension direction of the via hole structure 207, there are a plurality of auxiliary electrodes 202, and the plurality of auxiliary electrodes 202 are spaced apart from each other.

Figure 7:
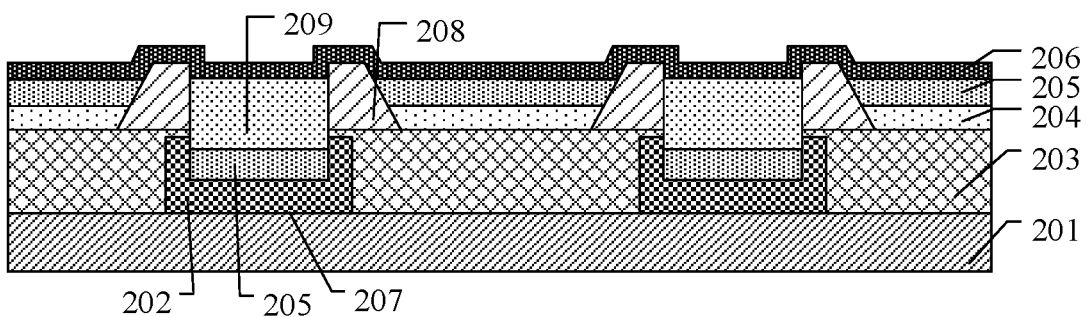
FIG. 7 is a schematic sectional view of an OLED array substrate provided by still another embodiment of the present disclosure.

For example, FIG. 7 is a schematic sectional view of an OLED array substrate provided by still another embodiment of the present disclosure. As illustrated in FIG. 7, the electroluminescent diode array substrate comprises a plurality of via hole structures 207 penetrating through the planarization layer 203 and the pixel definition layer 208, and the second electrode 206 is electrically connected with the auxiliary electrodes 202 by the plurality of via hole structures 207, so that the second electrode 206 is connected in parallel with the auxiliary electrodes 202 respectively. FIG. 7 shows two via hole structures 207. Obviously, the number of the via hole structures in the embodiments of the present disclosure is not limited to the above example, and more via hole structures 207 can be formed to further reduce the resistance of the second electrode and the auxiliary electrodes, in addition, the second electrode 206 connected in parallel with the auxiliary electrodes 202 through the plurality of via hole structures 207 increases the thickness of the second electrode 206, which is equivalent to increasing of the cross-sectional area of the second electrode 206, and the resistance of the second electrode 206 is further reduced.

For example, the pixel definition layer 208 is made of an organic insulating material (for example, an acrylic resin) or an inorganic insulating material (for example, silicon nitride SiNx or silicon oxide SiOx), the pixel definition layer 208 has an insulating property. The pixel definition layer 208 may be considered as the insulating structure disposed between the second electrode 206 and the auxiliary electrode 202.

For example, the first electrode 204 is made of a transparent conductive material, and the transparent conductive material includes indium tin oxide (ITO), indium zinc oxide (IZO), indium gallium oxide (IGO), zinc gallium oxide (GZO)), Indium oxide (In2O3), aluminum zinc oxide (AZO) and carbon nanotubes.

For example, the first electrode 204 is made of a metal conductive material, and the metal conductive material includes a single metal such as Cu, Cr, Mo, Au, Ag and Pt metal, or an alloy material formed of the above metals, for example, a copper chromium alloy (CuCr) or a chromium molybdenum alloy (CrMo).

For example, the first electrode 204 is a stacked structure formed by any combination of the above-mentioned transparent conductive material and the metal conductive material. For example, the first electrode 204 is in a structure that the metal conductive material is sandwiched between two transparent conductive materials, such as ITO-Mo-IZO, ITO-Cr—In2O3, ITO-Cu—ZnO and ITO-Pt-IGO, or the first electrode 204 is a stacked double-layer structure made of the metal conductive material and the transparent conductive material, such as IZO-Mo, ITO-Cr, ZnO—Mg and ITO-Au. For example, the stacked structure formed of any combination of the transparent conductive material and the metal conductive material is not limited to the stacked double-layer structure and the stacked triple-layer structure. It may also be a stacked structure with multiple layers of other layers, for example, a stacked structure of four layers, a stacked structure of five layers, etc.

It should be noted that, because the work function of the metal material or the work function of the alloy material for forming the first electrode is relatively low, the first electrode has poor compatibility with the organic material functional layer in the OLED array substrate. The transparent conductive material formed on a side of the first metal layer close to the functional layer formed of the organic material improves the work function of the first metal, so that the first electrode is better matched with the functional layer formed of the organic material. In addition, the first electrode of the double-layer structure or the triple-layer structure has a lower resistance than the first electrode of the single-layer structure, and the resistance of the first electrode is lower, in this way, the resistance of the first electrode is reduced.

For example, the material of the second electrode 206 includes magnesium, aluminum, lithium or other single metal, or magnesium aluminum alloy (MgAl), lithium aluminum alloy (LiAl), and the like.

For example, in the electroluminescent diode array substrate provided by at least one embodiment of the disclosure, taking the array substrate as the organic light-emitting diode (OLED) array substrate as an example, this functional layer includes a light-emitting layer, an electron injection layer, an electron transmission layer, a hole injection layer and a hole transmission layer.

For example, the method of manufacturing the functional layer in the organic light-emitting diode (OLED) array substrate includes a vacuum evaporation method and a solution method. The vacuum evaporation method is suitable for small organic molecules without solvent, and the thicknesses of each layers of organic material functional layer is uniform. The solution method includes a spin coating method, an inkjet printing method and a nozzle coating method, and the solution method is suitable for polymer materials and soluble small molecules, it has the advantage of low cost in production equipment, and has outstanding advantages in the production of large-scale and large-sized products, especially, the inkjet printing technology can accurately spray solution to the pixel region.

It should be noted that, unlike the organic light-emitting diode (OLED) array substrate, the quantum dots in the self-luminescent quantum dots light-emitting diodes (QLED) cannot adopt the same evaporation method as the self-luminescent OLEDs, due to the phenomenon that the quantum dots are easy to be affected by heat and moisture, and therefore only the ink-jet printing can be used.

At least one embodiment of the present disclosure further provides a display panel, and the display panel includes any one of the electroluminescent diode array substrate described above.

Figure 8:
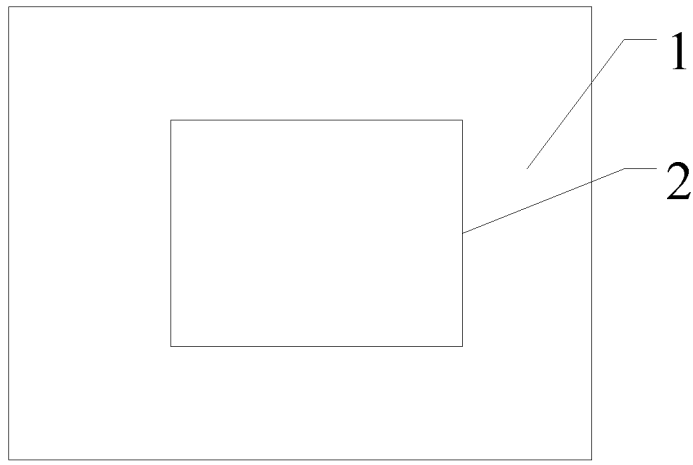
FIG. 8 is a block diagram of a display panel provided by an embodiment of the present disclosure.

For example, FIG. 8 is a block diagram of a display panel provided by an embodiment of the present disclosure. As illustrated in FIG. 8, the display panel 1 includes an electroluminescent diode array substrate 2 disposed therein. For example, the display panel 1 can be applied to a display apparatus, for example, the display apparatus is a mobile phone, a tablet computer, a television, a display, a notebook computer, a digital picture frame, a navigation system and any other product or component having a display function. The embodiments of the display apparatus can be referred to the above embodiments of the electroluminescent diode array substrate, which is omitted herein.

At least one embodiment of the present disclosure further provides a method of manufacturing an electroluminescent diode array substrate, and the electroluminescent diode array substrate is an organic light-emitting diode (OLED) array substrate or a quantum dot light-emitting diode (QLED) array substrate. The following is illustrated by taking the electroluminescent diode array substrate as the organic light-emitting diode (OLED) array substrate for example.

Figure 9:
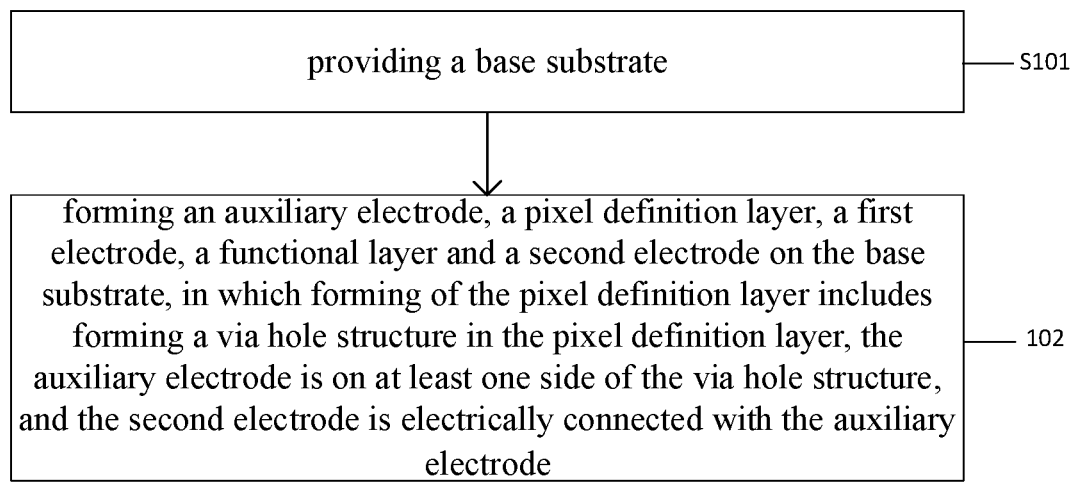
FIG. 9 is a flow diagram of a manufacturing method of an OLED array substrate provided by an embodiment of the present disclosure.

For example, FIG. 9 is a flow diagram of a manufacturing method of an OLED array substrate provided by an embodiment of the present disclosure. For example, the manufacturing method comprises the following steps:

S101: providing a base substrate.

S102: forming an auxiliary electrode, a pixel definition layer, a first electrode, a functional layer and a second electrode on the base substrate, in which forming of the pixel definition layer includes forming a via hole structure in the pixel definition layer, the auxiliary electrode is on at least one side of the via hole structure, and the second electrode is electrically connected with the auxiliary electrode.

For example, in the manufacturing method provided by at least one embodiment of the present disclosure, the upper surface of the auxiliary electrode on at least one side of the via hole structure is higher than the upper surface of the functional layer in the via hole structure, in this way, the auxiliary electrode is electrically connected to the second electrode through the portion of the auxiliary electrode that higher than the upper surface of the functional layer in the via hole structure.

For example, a planarization layer is formed before forming the pixel definition layer, and the via hole structure extends from the pixel definition layer to penetrate through the planarization layer, and the pixel definition layer is used for isolating two sub-pixel units adjacent to each other.

For example, the second electrode is electrically connected with the auxiliary electrodes by the plurality of via hole structures, so that the second electrode is connected in parallel with the auxiliary electrodes respectively. In addition, the second electrode connected in parallel with the auxiliary electrodes through the plurality of via hole structures increases the thickness of the second electrode, which is equivalent to increasing of the cross-sectional area of the second electrode, and the resistance of the second electrode 206 is further reduced.

For example, the pixel definition layer is made of an organic insulating material (for example, an acrylic resin) or an inorganic insulating material (for example, silicon nitride SiNx or silicon oxide SiOx), the pixel definition layer has an insulating property. The pixel definition layer may be considered as the insulating structure disposed between the second electrode and the auxiliary electrode.

For example, the manufacturing method provided by at least one embodiment of the present disclosure further includes forming a conductive polymer layer in the via hole structure, and the second electrode is electrically connected with the auxiliary electrode by the conductive polymer layer. In a case where the second electrode is directly connected to the auxiliary electrode, the second electrode may have a segment difference, that is, the second electrode is broken.

The conductive polymer layer is arranged in the via hole structure to raise the functional layer so as to prevent the second electrode from breaking.

For example, the thickness of the conductive polymer layer is larger than the thickness of the planarization layer, and the thickness of the conductive polymer layer is smaller than the sum of the thickness of the planarization layer and the thickness of the pixel definition layer.

For example, the upper surface of the conductive polymer layer is flush with an upper surface of the pixel definition layer, in this way, the risk that the second electrode having a segment difference is basically eliminated.

For example, the thickness of the conductive polymer layer is from about 2 μm to about 5.7 μm. For example, the thickness of the conductive polymer layer is 2 μm, 3 μm, 4 μm or 5 μm, etc.

For example, the conductivity of the conductive polymer layer is greater than $10^{-6}$ S/m, which ensures that the auxiliary electrode is electrically connected with the second electrode.

For example, the material of the conductive polymer layer comprises at least one of polypyrrole, polyphenylene sulfide, polyphthalocyanine, polyaniline and polythiophene.

For example, in the manufacturing method provided by the embodiment of the present disclosure, the conductive polymer layer is formed by an inkjet printing method.

For example, in an embodiment of the present disclosure, the thickness of the functional layer is from about 100 nm to about 300 nm, for example, the thickness of the functional layer is 100 nm, 200 nm or 300 nm, etc.

For example, the thickness of auxiliary electrode 202 is from about 0.5 μm to about 1 μm, such as 0.5 μm, 0.6 μm, 0.7 μm, 0.8 μm, 0.9 μm or 1 μm, etc.

For example, the thickness of planarization layer 203 is from about 1 μm to about 3 μm, such as 1 μm, 2 μm or 3 μm, etc.

For example, the thickness of the pixel definition layer 208 is from about 1 μm to about 3 μm, such as 1 μm, 2 μm or 3 μm, etc.

For example, thickness of the first electrode 204 is from about 200 μm to about 300 μm, for example, 200 μm, 250 μm, or 300 μm, etc.

For example, the thickness of the second electrode 206 is from about 100 μm to about 200 μm, for example, 100 μm, 150 μm, or 200 μm, etc.

The electroluminescent diode array substrate, the method of manufacturing the electroluminescent diode array substrate and the display panel provided by the embodiments of the present disclosure have at least one of the following beneficial effects:

(1) in the electroluminescent diode array substrate provided by at least one embodiment of the present disclosure, by changing the structural design of the auxiliary electrode, the electrical connection between the second electrode and the auxiliary electrode is ensured, in this way, the auxiliary electrode electrically connected with the second electrode increases the equivalent thickness of the second electrode.

(2) in the electroluminescent diode array substrate provided by at least one embodiment of the present disclosure, the resistance of the second electrode is reduced, and the problem that the large voltage drop caused by the large resistance of the second electrode in a case where the second electrode made of metallic silver with a thinner thickness is avoided.

(3) in the electroluminescent diode array substrate provided by at least one embodiment of the present disclosure, the problem of damaging an organic light-emitting display panel due to the large voltage drop is avoided.

The following points need to be explained:

(1) The drawings of the embodiments of the present disclosure are only related to the structures related to the embodiments of the present disclosure, and other structures can refer to general designs.

(2) For clarity, in the drawings for describing the embodiments of the present disclosure, a thickness of a layer or a thickness of a region is exaggerated or reduced, that is, these drawings are not drawn according to an actual scale. It should be understood that: in a case where an element such as a layer, a film, a region or a substrate is referred to as being disposed "on" or "beneath" another element, the element may be "directly" disposed "on" or "beneath" another element, or an intermediate element may be provided.

(3) In the absence of conflict, the embodiments of the present disclosure and the features in the embodiments can be combined with each other to obtain new embodiments.

What is described above is related to the illustrative embodiments of the disclosure only and not limitative to the scope of the disclosure. Therefore, the scopes of the disclosure are defined by the accompanying claims.

What is claimed is:

1. An electroluminescent diode array substrate, comprising:
   a base substrate, and
   an auxiliary electrode, a pixel definition layer, a first electrode, a functional layer, and a second electrode which are disposed on the base substrate, wherein the functional layer comprises a first portion and a second portion,
   wherein the pixel definition layer is provided with a via hole structure;
   the auxiliary electrode is disposed on at least one side of the via hole structure; and
   the second electrode is electrically connected with the auxiliary electrode,
   the electroluminescent diode array further comprises a planarization layer disposed between the base substrate and the pixel definition layer, and a conductive polymer layer,
   wherein the via hole structure extends from the pixel definition layer and penetrates through the planarization layer,
   the auxiliary electrode comprises an embedment part embedded in the planarization layer, the embedment part is electrically connected with the second electrode by the conductive polymer layer and the embedment is not directly in contact with the second electrode, a second portion of the functional layer is disposed on a side of the auxiliary electrode away from the substrate, the conductive polymer layer is disposed on a side of the second portion of the functional layer away from the base substrate,
   both of an orthographic projection of the conductive polymer layer on the base substrate and an orthographic projection of the functional layer on the base substrate are completely within an orthographic projection of the via hole structure on the base substrate,
   a thickness of the conductive polymer layer is larger than a thickness of the planarization layer in a direction perpendicular to the base substrate, the thickness of the conductive polymer layer is smaller than a sum of a thickness of the planarization layer and a thickness of the pixel definition layer, and the conductive polymer layer directly contacts with the planarization layer in a direction parallel to the base substrate.

2. The electroluminescent diode array substrate according to claim 1, wherein a surface of the embedment part away from the base substrate is closer to the base substrate than a surface of the planarization layer away from the base substrate.

3. The electroluminescent diode array substrate according to claim 1, wherein the functional layer comprises a bottom surface close to the base substrate and an upper surface away from the base substrate, and a side face connecting the bottom surface and the bottom surface, a distance from the upper surface to the base substrate is less than a distance from the surface of the embedment part to the base substrate, and the embedment part is directly in contact with side face.

4. The electroluminescent diode array substrate according to claim 1, wherein a material of the conductive polymer layer is different from a material of the functional layer.

5. The electroluminescent diode array substrate according to claim 1, wherein an upper surface of the auxiliary electrode is higher than an upper surface of the functional layer in the via hole structure.

6. The electroluminescent diode array substrate according to claim 1, wherein the auxiliary electrode is a structure in a U shape.

7. The electroluminescent diode array substrate according to claim 1, wherein the auxiliary electrode is a plate-type structure; or there are a plurality of auxiliary electrodes which are spaced apart from each other.

8. The electroluminescent diode array substrate according to claim 1, wherein a thickness of the conductive polymer layer is less than a thickness of the pixel definition layer.

9. The electroluminescent diode array substrate according to claim 1, wherein a conductivity of the conductive polymer layer is greater than 10-6 S/m.

10. The electroluminescent diode array substrate according to claim 1, wherein a material of the conductive polymer layer comprises at least one of polypyrrole, polyphenylene sulfide, polyphthalocyanine, polyaniline and polythiophene.

11. The electroluminescent diode array substrate according to claim 1, wherein an upper surface of the conductive polymer layer is flush with an upper surface of the pixel definition layer.

12. The electroluminescent diode array substrate according to claim 1, wherein there are a plurality of via hole structures penetrating through the planarization layer and the pixel definition layer, and the second electrode is electrically connected with the auxiliary electrode by the plurality of via hole structures.

13. The electroluminescent diode array substrate according to claim 1, wherein a thickness of the functional layer is from about 100 nm to about 300 nm, a thickness of the auxiliary electrode is from about 0.5 μm to about 1 μm, a thickness of the planarization layer is from about 1 μm to about 3 μm, a thickness of the pixel definition layer is from about 1 μm to about 3 μm, and a thickness of the conductive polymer layer is from about 2 μm to about 5.7 μm.

14. The electroluminescent diode array substrate according to claim 13, wherein the functional layer comprises at least one of a light-emitting layer, an electron injection layer, an electron transmission layer, a hole injection layer and a hole transmission layer.

* * * * *